US006165275A

United States Patent [19]

Kamei

[11] Patent Number: 6,165,275

[45] Date of Patent: Dec. 26, 2000

[54] ATMOSPHERIC GAS GENERATOR FOR HEAT TREATMENT

[75] Inventor: Yasuyuki Kamei, Osaka, Japan

[73] Assignee: Osaka Sanso Kogyo Ltd., Osaka, Japan

[21] Appl. No.: 09/151,629

[22] Filed: Sep. 11, 1998

[30] Foreign Application Priority Data

Sep. 19, 1997 [JP] Japan .................................... 9-255662

[51] Int. Cl.[7] ...................................................... C23C 16/00

[52] U.S. Cl. ............................................ 118/725; 118/726

[58] Field of Search ...................................... 118/726, 725

[56] References Cited

U.S. PATENT DOCUMENTS 5,451,260 9/1995 Versteeg .................................. 118/726

FOREIGN PATENT DOCUMENTS 058571 8/1982 European Pat. Off. .

*Primary Examiner*—Richard Bueker
*Attorney, Agent, or Firm*—Salvatore P. Pace

[57] ABSTRACT

An atmospheric gas generator for heat treatment includes a heat treatment furnace for performing heat treatment of a metal material; an alcohol supply device for supplying alcohol to the heat treatment furnace; a nitrogen gas supply device for supplying nitrogen gas to the heat treatment furnace; and a nozzle having an end protruding into the heat treatment furnace. An atmospheric gas is generated by introducing the alcohol supplied by the alcohol supply device and the nitrogen gas supplied by the nitrogen gas supply device into the heat treatment furnace via the nozzle. The nozzle includes an alcohol introduction pipe, a nitrogen gas introduction pipe, and a venturi section provided in connection with a tip of the alcohol introduction pipe and with a tip of the nitrogen gas introduction pipe.

6 Claims, 8 Drawing Sheets

ATMOSPHERIC GAS GENERATOR FOR HEAT TREATMENT

BACKGROUND OF THE INVENTION

The present invention relates to an atmospheric gas generator for heat-treating a metal material, and in particular to an apparatus for generating a carrier gas or an atmospheric gas for performing heat treatment to carburize, refine or carbonitrify a metal material.

An atmospheric gas for heat treatment performed to carburize, refine or carbonitrify a metal material is generally generated either by a metamorphic furnace system by which hydrocarbon gas in a metamorphic furnace is reacted with air by a catalyst, or by a dropping system by which a liquid organic solvent (typically, alcohol such as methanol; hereinafter, referred to simply as "alcohol") is thermally decomposed.

With respect to the metamorphic furnace system, it is difficult to generate an atmospheric gas having a stable composition without an experienced artisan in operation and maintenance of the metamorphic furnace. Thus, the dropping system, which does not involve such complicated operations or maintenance, has become a target of attention as a system for supplying an atmospheric gas having a stable composition in a heat treatment furnace.

There are two types of dropping systems. According to one type, an atmospheric gas is generated by thermally decomposing, in the furnace, only an alcohol which includes an additive for fixing the carbon concentration of the post-decomposition atmospheric gas. According to the other type, an atmospheric gas is generated by putting an alcohol containing no additive and nitrogen gas into the furnace. The latter type has been used recently mainly due to its flexibility in adjusting the carbon concentration in the atmospheric gas and its effect of reducing an oxide layer on a surface of a metal product to be heat-treated.

It is important that the atmospheric gas used for heat-treating a metal material should have a stable composition. Accordingly, when a dropping system is used, it is necessary to control the gas supplied to the furnace to have a stable flow rate and to provide a heat source which is sufficient for the alcohol to be decomposed.

Conventionally known methods for supplying alcohol and nitrogen gas into a heat treatment furnace include, for example: (1) thermally decomposing alcohol in a heating chamber provided inside or outside the furnace and supplying the generated gas into the furnace, (2) supersonically atomizing alcohol in the furnace, (3) supplying a mixture of gas and alcohol vapor, and (4) supplying alcohol and nitrogen gas through a nozzle to the furnace.

Method (1) is disclosed in Japanese Laid-Open Publication No. 62-60818, Japanese Publication for Opposition No. 63-50430, and Japanese Publication for Opposition No. 63-47771.

For example, a method for supplying an atmospheric gas disclosed in Japanese Laid-Open Publication No. 62-60818 is carried out as shown in FIG. 6. Liquid alcohol is dropped to a decomposing chamber 62 in a heat treatment furnace 61 through an alcohol introduction pipe 60 and heated by the temperature inside the heat treatment furnace 61 and a heater 63 to be decomposed into gas. The resultant gas is taken out of the decomposing chamber 62 to a position slightly above a stirring rotating fan 64 through an outlet 65. Then, the gas is stirred by the stirring rotating fan 64 to be diffused in the heat treatment furnace 61 outside the decomposing chamber 62.

Method (1) is alternatively carried out as shown in FIG. 7. Liquid alcohol supplied from the alcohol introduction pipe 60 through a vaporizing device 66 is heated by a heater 67 in the vaporizing device 66 to be in a vaporized state. The vaporized alcohol is guided to the heat treatment furnace 61 through an outlet 68 of the alcohol introduction pipe 60, the outlet 68 being located in the vicinity of the stirring rotating fan 64. Then, the vaporized alcohol is stirred by the stirring rotating fan 64 to be diffused in the heat treatment furnace 61.

Japanese Publication for Opposition No. 63-50430 discloses a method of providing a double chamber furnace including an outer chamber and an inner chamber, so that gas obtained by decomposing alcohol in the outer chamber is mixed with nitrogen gas and the resultant mixture is supplied to the inner chamber as an atmospheric gas.

However, these methods require a furnace having a more complicated structure and also require heavy maintenance. Moreover, the structure of the heat treatment furnace would need to be altered when switching between use of a dropping system and metamorphic furnace system for supplying the atmospheric gas.

Method (2) is disclosed in Japanese Publication for Opposition No. 63-47772. According to this method, unless the alcohol is in an ideal position in the furnace, the alcohol vapor accumulates on the bottom of the furnace due to the high specific gravity thereof. Then, the alcohol vapor directly contacts the metal product to be heat-treated, thus imposing an adverse effect on the quality of the product. As shown in the figure in the Japanese Publication for Opposition No. 63-47772, this method requires a supersonic forcible atomizing device, and therefore requires a large power source and ongoing maintenance.

Method (3) is disclosed in Japanese Laid-Open Publication No. 59-53676. According to this method, an atmospheric gas is generated by vaporizing alcohol by a vaporizer outside a heat treatment furnace and decomposing the alcohol in a hearth filled with fire-resistant particles. This method requires a furnace having a special structure including a vaporizer and a furnace floor. Existing furnaces cannot be used to generate an atmospheric gas from alcohol. This method further requires a heat source for the vaporizer, and maintenance of the vaporizer and the hearth.

Method (4) is disclosed in Japanese Publication for Opposition No. 63-47771 and is carried out as shown in FIG. 8. Liquid alcohol introduced into the heat treatment furnace 61 through an alcohol introduction pipe 71 of a nozzle 70 is mixed with nitrogen gas in the heat treatment furnace 61. The nitrogen gas is, while rotating by spiral grooves 72*a* at an end of a nitrogen introduction pipe 72, being expelling forcefully in the direction in which the alcohol introduction pipe 71 is inserted into the heat treatment furnace 61. The spiral grooves 72*a* are formed on an inner wall of the nitrogen introduction pipe 72. The liquid alcohol flows along the wall 61*a* of the heat treatment furnace 61 while being stirred by the stirring rotating fan 64 together with additional gas which is supplied through an additional gas introduction pipe 73.

According to this method, unless the nozzle 70 for supplying the alcohol via the alcohol introduction pipe 71 and the nitrogen gas via the nitrogen introduction pipe 72 is provided in the vicinity of the stirring rotating fan 64, the gas and alcohol expelled forcefully from the nozzle 70 is directly contacts the metal product to be heat-treated, thereby imposing an adverse effect on the quality of the product. This problem restricts the configuration of the heat treatment furnace 61. Moreover, when the supply of the atmospheric gas is stopped, the liquid alcohol remaining in the alcohol introduction pipe 71 is thermally decomposed and clogs the nozzle 70 as soot.

SUMMARY OF THE INVENTION

An atmospheric gas generator for heat treatment according to the present invention includes a heat treatment furnace for performing heat treatment of a metal material; an alcohol supply device for supplying alcohol to the heat treatment furnace; a nitrogen gas supply device for supplying nitrogen gas to the heat treatment furnace; and a nozzle having an end protruding into the heat treatment furnace. An atmospheric gas is generated by introducing the alcohol supplied by the alcohol supply device and the nitrogen gas supplied by the nitrogen gas supply device into the heat treatment furnace via the nozzle. The nozzle includes an alcohol introduction pipe, a nitrogen gas introduction pipe, and a venturi section provided in connection with a tip of the alcohol introduction pipe and with a tip of the nitrogen gas introduction pipe.

In one embodiment of the invention, the venturi section includes a smalldiameter portion and a funnel-shaped large-diameter portion provided downstream with respect to the small-diameter portion, and the tip of the alcohol introduction pipe is coupled at least in part to the large-diameter portion.

In one embodiment of the invention, the venturi section is provided perpendicular to a direction in which the nozzle protrudes into the heat treatment furnace, so as to forcefully expel the atmospheric gas from the large-diameter portion to be released along a wall of the heat treatment furnace.

In one embodiment of the invention, the alcohol supply device includes a transfer pump and is connected to the nozzle via an alcohol supply path.

In one embodiment of the invention, the alcohol introduction pipe is provided inside the nitrogen gas introduction pipe.

In one embodiment of the invention, the atmospheric gas generator for heat treatment further includes an alcohol supply pipe for supplying the alcohol to the alcohol introduction pipe of the nozzle from the alcohol supply device, the supply pipe having a first shut-off valve closable in response to an alcohol supply termination signal from a control device; and a nitrogen gas supply pipe for supplying the nitrogen gas from the nitrogen gas supply device to the nitrogen gas introduction pipe of the nozzle. The alcohol supply pipe and the nitrogen gas supply pipe are connected to each other by a connection pipe downstream with respect to the first shut-off valve, and the connection pipe has a second shut-off valve openable in response to an alcohol supply termination signal from the control device.

Thus, the invention described herein makes possible the advantages of (1) providing an atmospheric gas generator for heat treatment such that an atmospheric gas is generated from alcohol using an existing furnace without any specific restriction on the form or the like of the furnace or any specific restriction on the position of the alcohol vapor in the furnace or the position of a rotating fan in the furnace; (2) providing an atmospheric gas generator for heat treatment which requires only light maintenance; and (3) providing an atmospheric gas generator for heat treatment for preventing alcohol remaining in an alcohol introduction pipe from being thermally decomposed in a nozzle even when the supply of an atmospheric gas is stopped.

These and other advantages of the present invention will become apparent to those skilled in the art upon reading and understanding the following detailed description with reference to the accompanying figures.

DETAILED DESCRIPTION

Hereinafter, the present invention will be described by way of illustrative examples with reference to the accompanying drawings.

Figure 1:
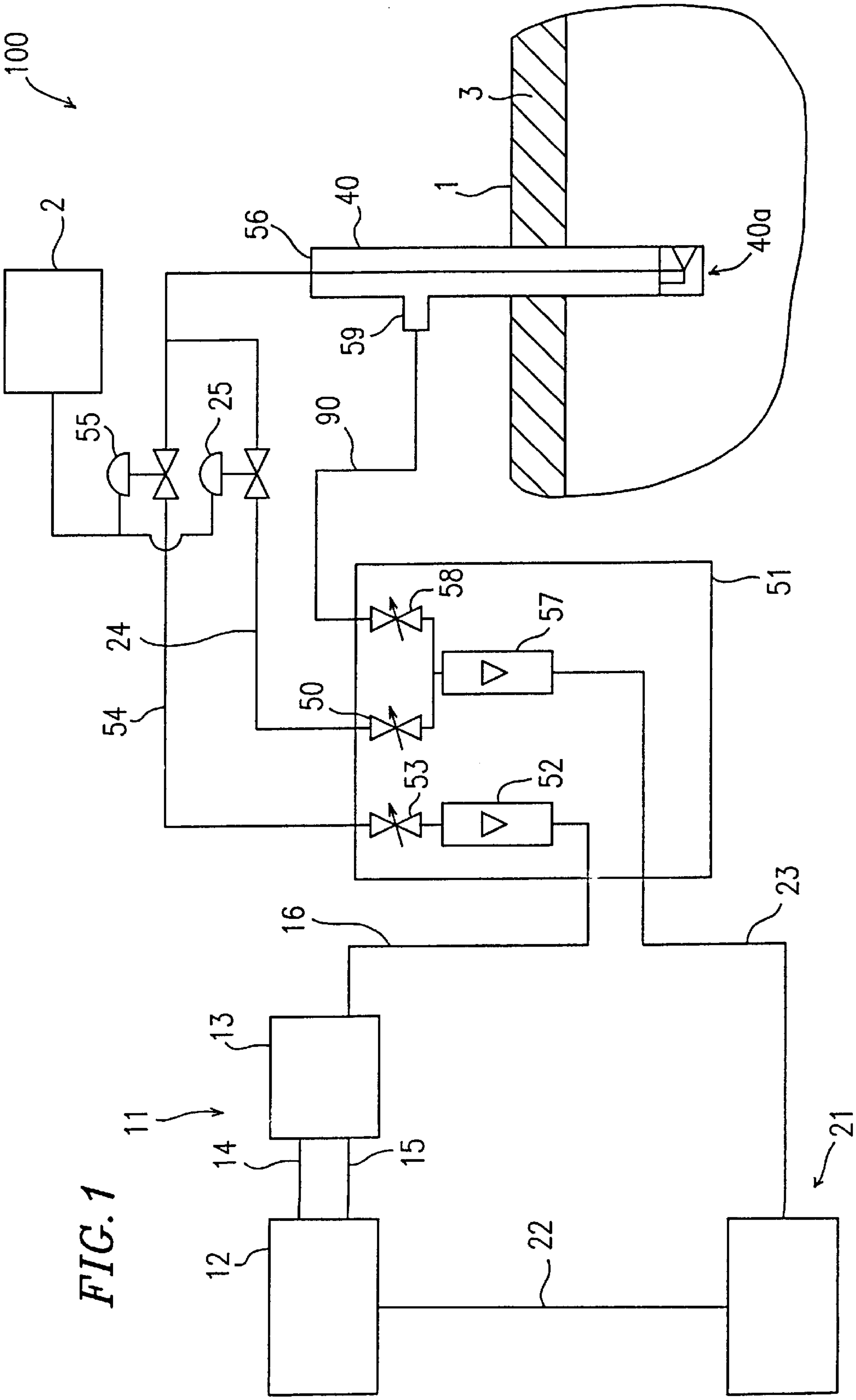
FIG. 1 is a schematic view of an atmospheric gas generator according to one example of the present invention.

FIG. 1 is a schematic view of an atmospheric gas generator 100 according to one example of the present invention. As shown in FIG. 1, the atmospheric gas generator 100 includes a heat treatment furnace 1 for heat-treating a metal material, an alcohol supply device 11 for supplying liquid alcohol to the heat treatment furnace 1, a nitrogen gas supply device 21 for supplying nitrogen gas to the heat treatment furnace 1, and a nozzle 40 attached to the heat treatment furnace 1 and having an end 40*a* protruding into the heat treatment furnace 1. The atmospheric gas generator 100 further includes a flow rate adjustment device 51, provided between the heat treatment furnace 1 and both the alcohol supply device 11 and the nitrogen gas supply device 21, for adjusting the flow rate of the alcohol and the nitrogen gas.

The alcohol supply device 11 includes an alcohol micropressure tank 12 and a transfer pump 13. The alcohol micropressure tank 12 is connected to the pump 13 by an alcohol take-out pipe 14 and an alcohol return pipe 15. The alcohol micropressure tank 12 and the transfer pump 13 allow the alcohol to be supplied at a constant pressure regardless of the amount or the pressure of the alcohol in the alcohol micropressure tank 12. Since the alcohol micropressure tank 12 can be kept open while the alcohol is supplied to the heat treatment furnace 1, the alcohol micropressure tank 12 can be filled with alcohol during such a supply.

A part of the alcohol which is used as being maintained at a constant pressure by a pressure-reduction valve (not shown) of the transfer pump 13 is supplied to the flow rate adjustment device 51 through an alcohol supply pipe 16. The rest of the alcohol having an increased pressure is returned to the alcohol micropressure tank 12 through the alcohol return pipe 15.

The flow rate adjustment device 51 includes an alcohol flow meter 52, an alcohol flow rate adjustment valve 53 provided at an exit of the alcohol flow meter 52, an alcohol supply pipe 54, a shut-off valve 55 provided on the alcohol supply pipe 54, and an alcohol supply opening 56.

The alcohol transferred to the flow rate adjustment device 51 is adjusted to a prescribed amount by the alcohol flow meter 52 and the alcohol flow rate adjustment valve 53. Then, the alcohol passes the shut-off valve 55 and is supplied to the nozzle 40 via the alcohol supply opening 56. The path for supplying the alcohol from the alcohol supply device 11 to the nozzle 40 is referred to as an alcohol supply path.

The nitrogen gas supply device 21 includes a liquid nitrogen tank, a gas evaporator or a pressure swing absorption system nitrogen generation apparatus (PSA) or a film separation system nitrogen generation apparatus, and a pressure reduction device. The nitrogen gas supply device 21 is connected to the alcohol micropressure tank 12 through a nitrogen gas micropressure pipe 22. The nitrogen gas, which is maintained at a constant micropressure by a pressure-reduction valve (not shown) of the nitrogen gas supply device 21, is supplied to the alcohol micropressure tank 12 through the nitrogen gas micropressure pipe 22 in order to prevent the inner pressure of the alcohol micropressure tank 12 from changing during consumption of the alcohol and also in order to prevent external air from entering the alcohol micropressure tank 12.

The flow rate adjustment device 51 further includes a nitrogen flow meter 57, a nitrogen flow rate adjustment valve 58 provided at an exit of nitrogen flow meter 57, a nitrogen gas supply pipe 90 and a nitrogen gas supply opening 59.

The nitrogen gas from the nitrogen gas supply device 21 is also supplied to the flow rate adjustment device 51 through a nitrogen gas supply pipe 23 at a constant pressure. The nitrogen gas is then adjusted to a prescribed amount by the nitrogen flow meter 57 and the nitrogen flow rate adjustment valve 58. After that, the nitrogen gas is supplied to the nozzle 40 through the nitrogen gas supply pipe 90 and the nitrogen gas supply opening 59.

The shut-off valve 55 provided on the alcohol supply pipe 54 is closable in response to an alcohol supply termination signal which is output by a control device 2. The alcohol supply pipe 54 and the nitrogen gas supply pipe 23 are connected to each other via a connection pipe 24 downstream with respect to the shut-off valve 55. The connection pipe 24 connects to the nitrogen gas supply pipe 23 through the flow rate adjustment device 51. A shut-off valve 25 is provided on the connection pipe 24 and is openable in response to an alcohol supply termination signal output by the control device 2.

In order to stop operations of the heat treatment furnace 1, the shut-off valve 55 provided on the alcohol supply pipe 54 is closed by an alcohol supply termination signal from the control device 2, and simultaneously the shut-off valve 25 provided on the connection pipe 24 is opened. Thus, the nitrogen gas supplied from the nitrogen gas supply device 21 at a constant pressure passes through the nitrogen gas supply pipe 23 and is adjusted to have a prescribed flow rate by the nitrogen flow meter 57 and a nitrogen flow rate adjustment valve 50 of the flow rate adjustment device 51. Then, the nitrogen gas passes the shut-off valve 25 provided on the connection pipe 24 and is introduced into an alcohol introduction pipe 41 (FIG. 2) of the nozzle 40 through the alcohol supply opening 56. After a time period sufficient for allowing the nitrogen to substitute the remaining alcohol in the alcohol supply opening 56 and in the alcohol introduction pipe 41 of the nozzle 40, the shut-off valve 25 is closed by a nitrogen gas supply termination signal from the control device 2. Thus, the alcohol introduction pipe 41 in the nozzle 40 is prevented from being clogged with soot generated by thermal decomposition of the alcohol remaining in the alcohol introduction pipe 41 in the nozzle 40.

Figure 2:
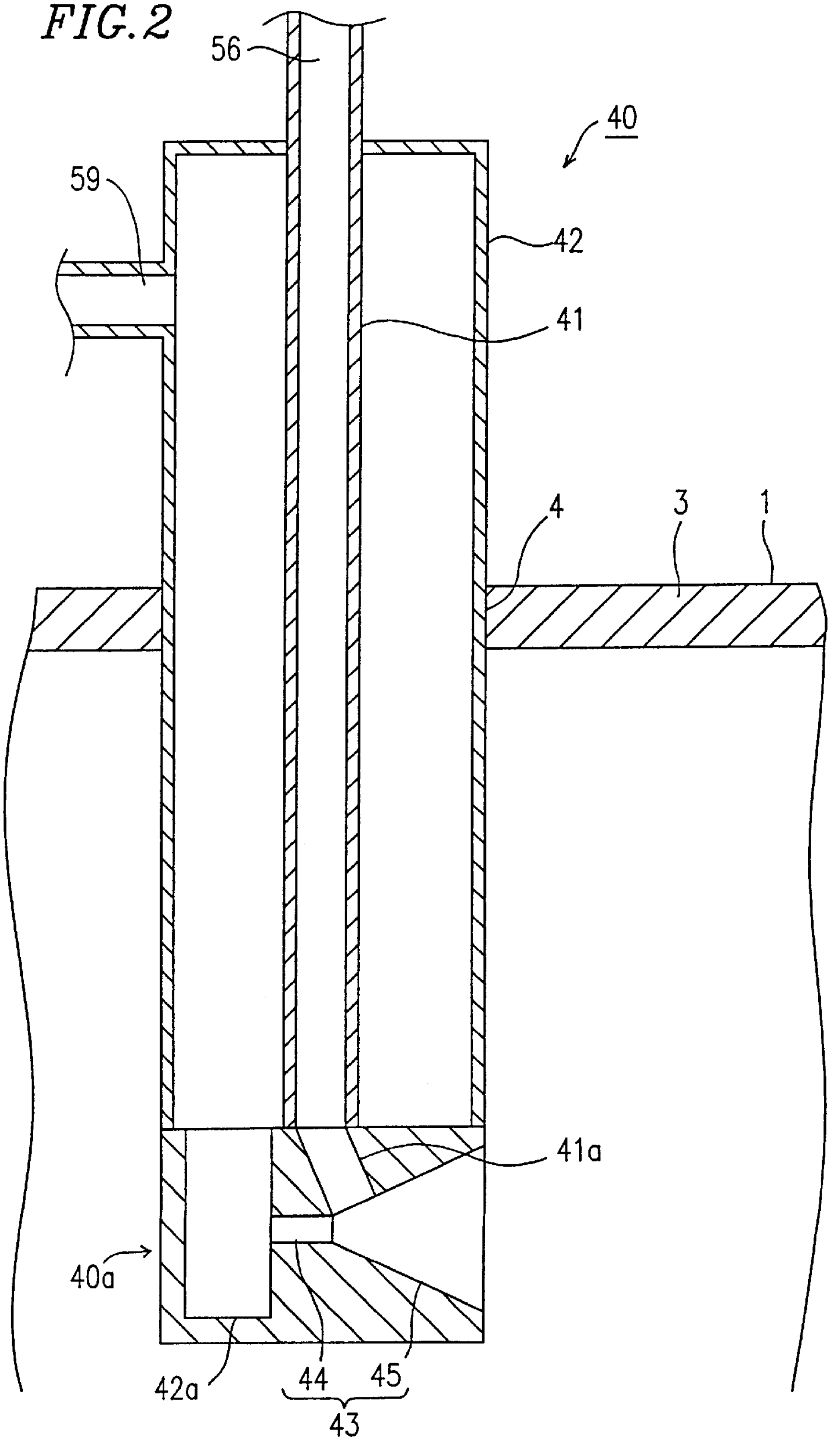
FIG. 2 is a partially cut cross-sectional view of the nozzle in an example of the present invention.

FIG. 2 is a partially cut cross-sectional view of the nozzle 40. As shown in FIGS. 1 and 2, the end 40*a* of the nozzle 40 protrudes into the heat treatment furnace 1 through a hole 4 formed on a wall 3 of the heat treatment furnace 1. The nozzle 40 includes the alcohol introduction pipe 41 and a nitrogen gas introduction pipe 42. In FIG. 2, the alcohol introduction pipe 41 which has a cylindrical shape is provided concentrically within the nitrogen gas introduction pipe 42, which also has a cylindrical shape, so as to form a double cylinder structure. The nozzle 40 includes a venturi section 43 in the end 40*a* thereof.

The venturi section 43 includes a small-diameter portion 44 coupled to a funnel-shaped large-diameter portion 45. A tip 41*a* of the alcohol introduction pipe 41 is coupled at least in part to the large-diameter portion 45 although in this example, the tip 41*a* is completely connected to the large-diameter portion 45. The tip 42*a* of the nitrogen gas introduction pipe 42 is connected to the small-diameter portion 44. Since the flow rate of the nitrogen gas is higher in the small-diameter portion 44 than in the nitrogen introduction pipe 42, a negative pressure for absorbing the alcohol is generated so as to smooth the flow of the alcohol. The alcohol passed from the tip 41*a* of the alcohol introduction pipe 41 to the venturi section 43 is mixed with the nitrogen gas having an increased flow rate and is force-fully expelled into the heat treatment furnace 1 in an atomized state. More particularly, the large-diameter portion 45 is opened to the heat treatment furnace 1 so that the atomized mixture of the alcohol and the nitrogen gas flows along the wall 3 of the heat treatment furnace 1.

The nozzle 40 having such a structure allows the mixture of the alcohol and the nitrogen gas in the atomized state to flow along the wall 3 of the heat treatment furnace 1 and reach a heat source (not shown) for heat-treating products to be heat-treated, so as to stably generate an atmospheric gas without the need to provide a stirring fan or, in the case where a stirring fan is provided, without the need to provide the nozzle 40 in the vicinity of the stirring fan. Since the nitrogen gas and the liquid alcohol supplied to the venturi section 43 of the nozzle 40 are introduced at their own respective pressure, the nozzle 40 can be inserted into the heat treatment furnace 1 in any direction.

Accordingly, the position of the nozzle 40 is not restricted. Since only the nitrogen gas is used to place the alcohol in the heat treatment furnace 1 in an atomized state and a heater or other devices are not used, no heat source or corresponding maintenance is required for the nozzle 40. In consequence, the alcohol can be introduced into the heat treatment furnace I more easily and with a simpler furnace structure. In the case where, as shown in FIG. 2, the nitrogen gas introduction pipe 42 has a cylindrical shape, the nozzle 40 can be attached to the heat treatment furnace 1 simply by forming the hole 4 in the wall 3 and inserting the nozzle 40 into the hole 4.

Figure 3:
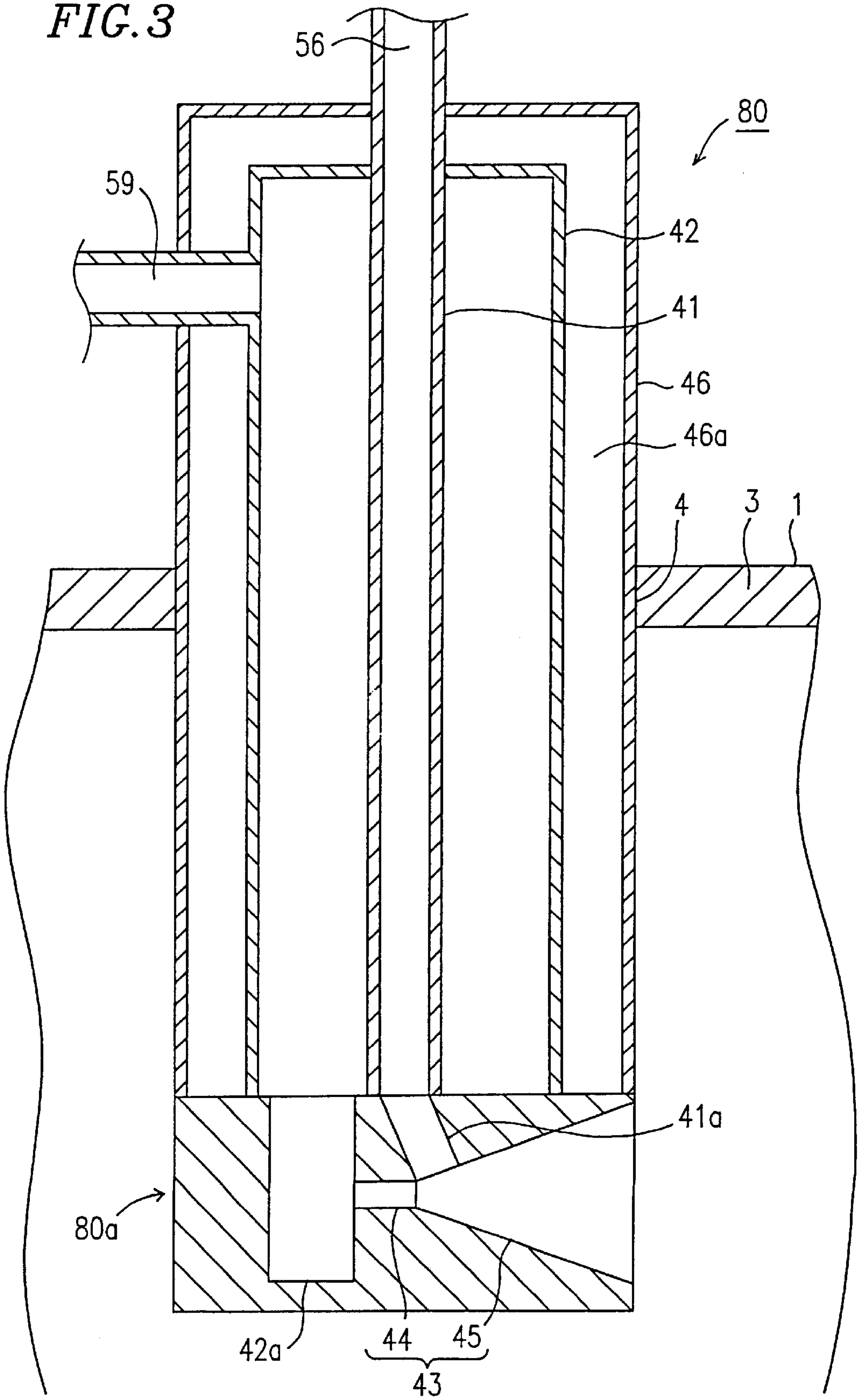
FIG. 3 is a partially cut cross-sectional view of another exemplary nozzle usable for the present invention.

FIG. 3 is a partially cut cross-sectional view of a nozzle 80 in an alternative example. The nozzle 80 includes the structure shown in FIG. 2 along with a cylindrical outer pipe 46 concentrically surrounding an outer portion of the nitrogen gas introduction pipe 42. The outer pipe 46 and the nitrogen gas introduction pipe 42 are thermally insulated from each other by a vacuum 46*a*.

In FIG. 3, the alcohol introduced from the alcohol supply opening 56 to the nozzle 80 is supplied to an end 80*a* of the nozzle 80 through the alcohol introduction pipe 41. The nitrogen gas introduced from the nitrogen gas supply pipe 90 (FIG. 1) and the nitrogen gas supply opening 59 to the nozzle 80 is supplied to the tip 80*a* through the nitrogen introduction pipe 42. Since the outer pipe 46 and the nitrogen gas introduction pipe 42 are thermally insulated from each other by vacuum 46*a* as described above, the heat inside the heat treatment furnace 1 is prevented, by the vacuum 46*a*, from being transferred to the alcohol introduction pipe 41 through the nitrogen gas flowing in the nitrogen gas introduction pipe 42. Such a structure avoids an undesirable possibility that when the flow rate of nitrogen gas flowing in the nitrogen gas introduction pipe 42 is excessively low, the liquid alcohol partially vaporizes in the alcohol introduction pipe 41 to form gas bubbles, resulting in an unstable flow rate of the alcohol.

Figure 4:
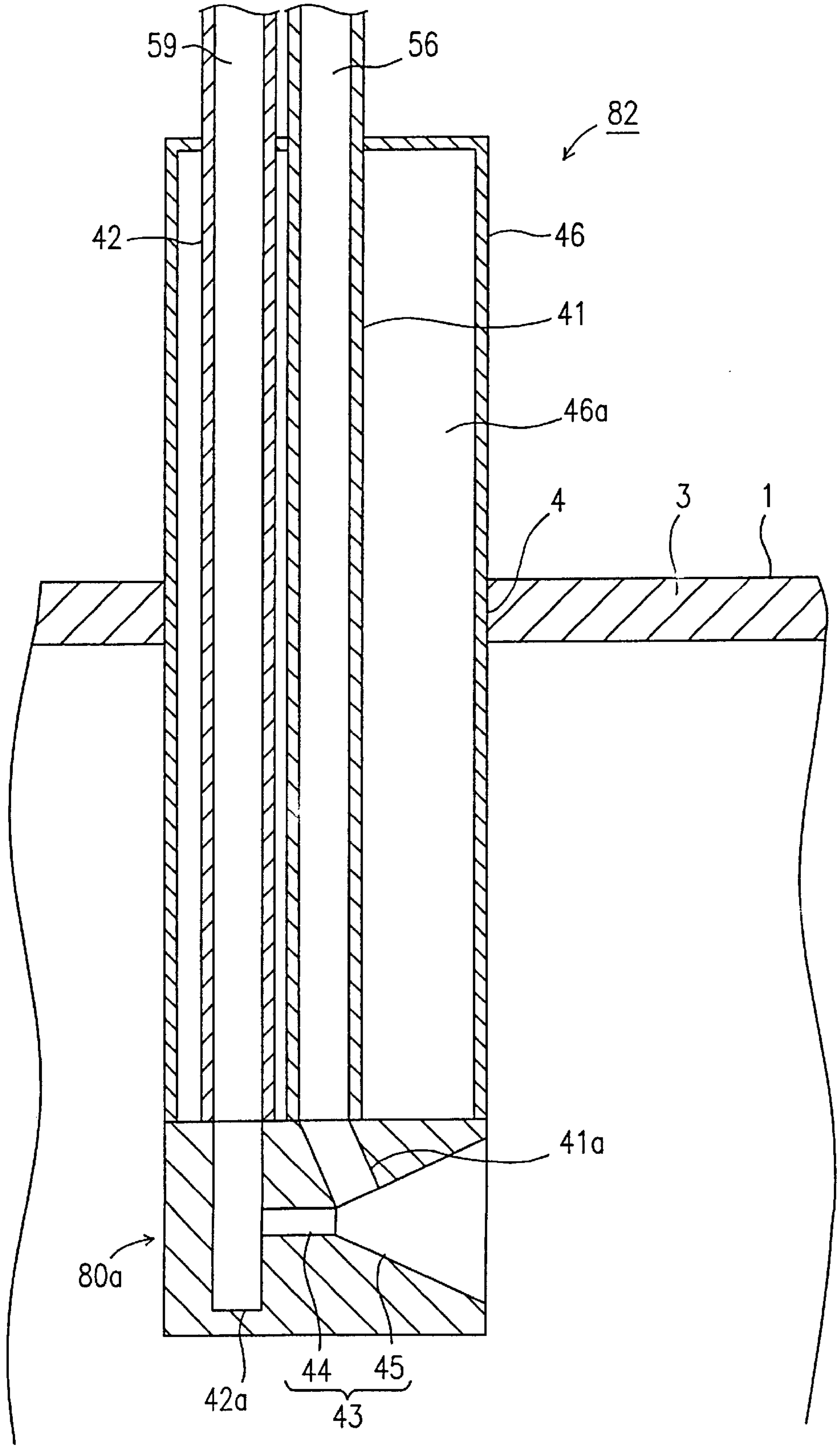
FIG. 4 is a partially cut cross-sectional view of still another exemplary nozzle usable for the present invention.

FIG. 4 is a partially cut cross-sectional view of a nozzle 82 in still another example. In the nozzle 82, the alcohol introduction pipe 41 and the nitrogen gas introduction pipe 42 are provided in the cylindrical outer pipe 46. The outer pipe 46 is thermally insulated from the alcohol introduction pipe 41 and also from the nitrogen gas introduction pipe 42 by the vacuum 46*a*. In this structure also, the heat inside the heat treatment furnace 1 is prevented, by the vacuum 46*a*, from being transferred to the alcohol introduction pipe 41. Accordingly, the above-described phenomenon of the liquid alcohol partially vaporizing in the alcohol introduction pipe 41 to form gas bubbles and subsequently causing an unstable flow rate of the alcohol is avoided.

Figure 5A:
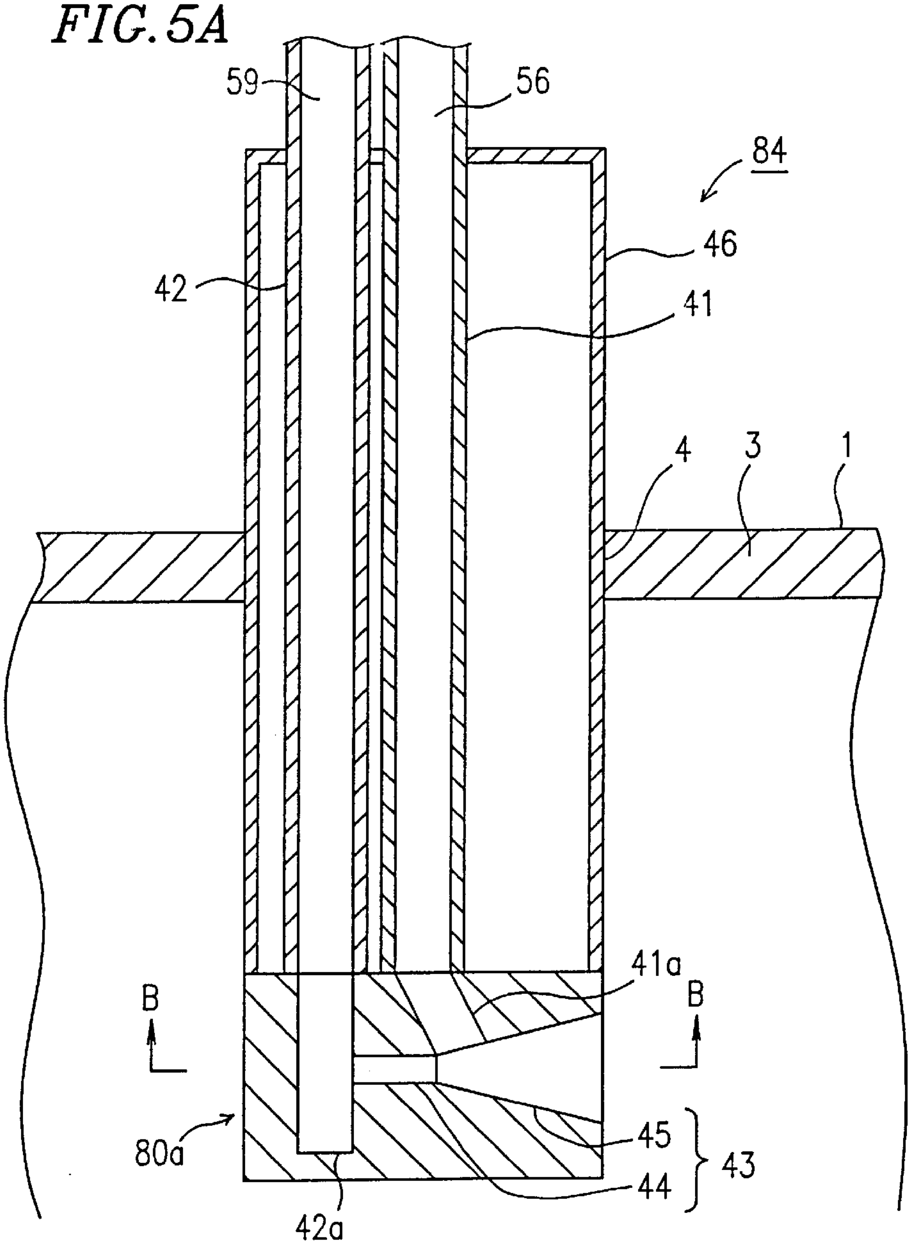
FIG. 5A is a partially cut cross-sectional view of yet another exemplary nozzle usable for the present invention.
Figure 5B:
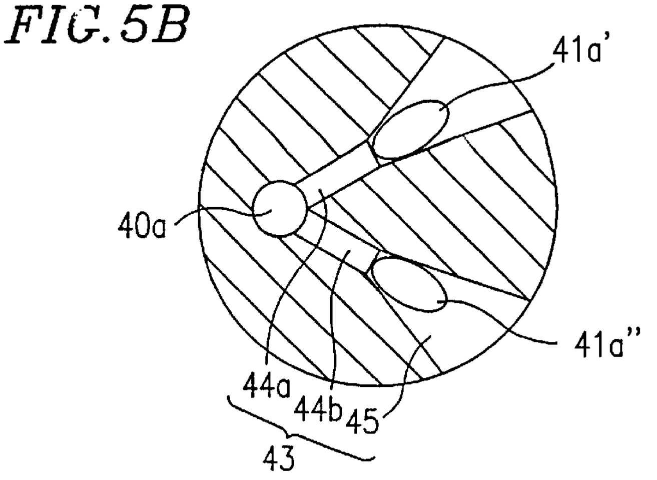
FIG. 5B is a cross-sectional view of the nozzle shown in FIG. 5A taken along lines B—B in FIG. 5A.
Figure 6:
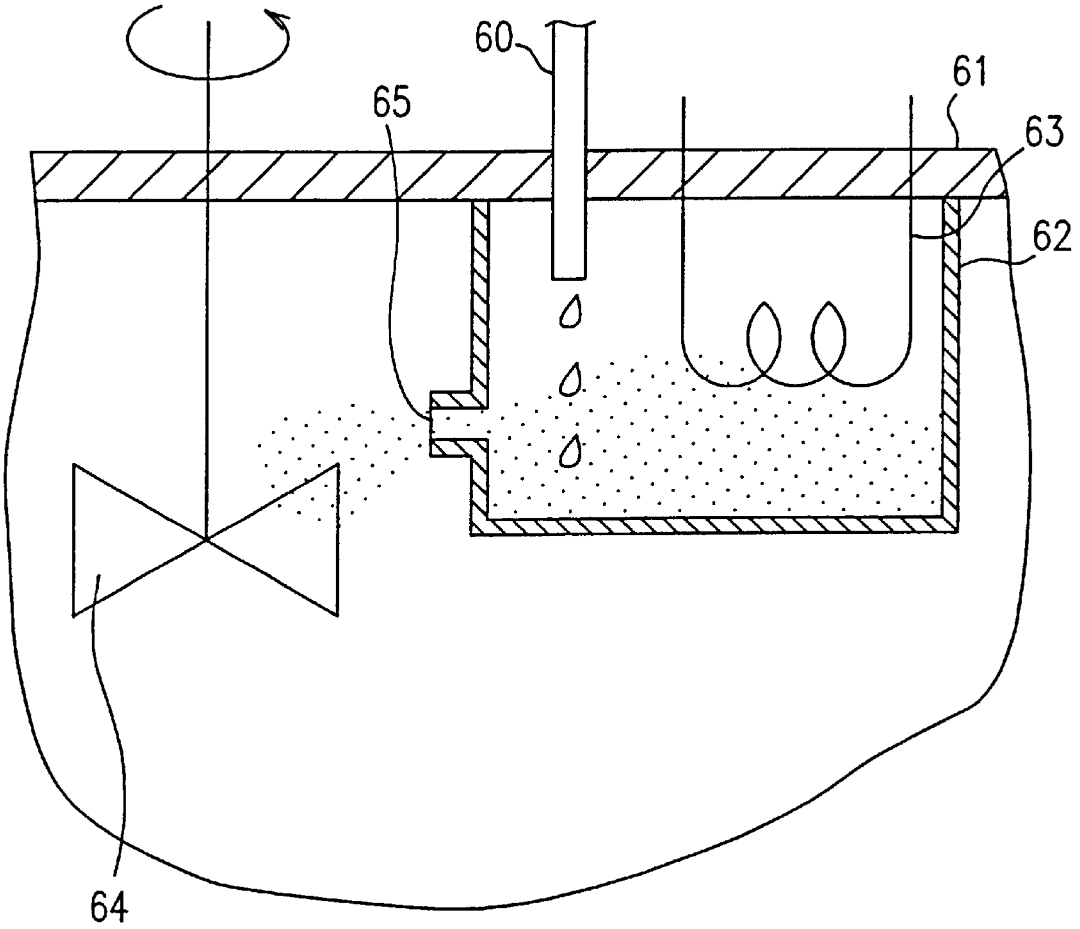
FIG. 6 is a schematic cross-sectional view illustrating a conventional method for supplying alcohol into a heat treatment furnace.
Figure 7:
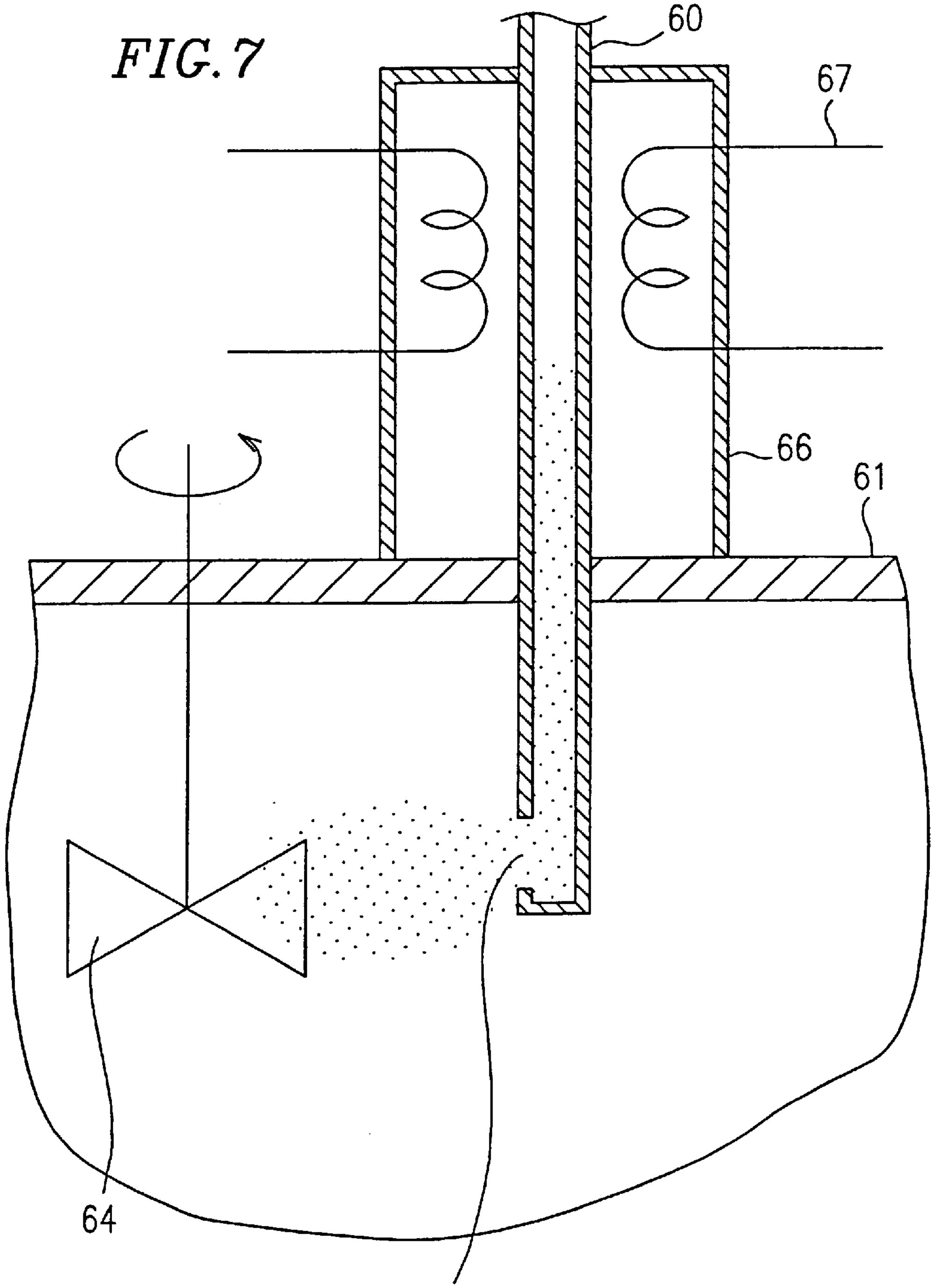
FIG. 7 is a schematic cross-sectional view of illustrating another conventional method for supplying alcohol into a heat treatment furnace.
Figure 8:
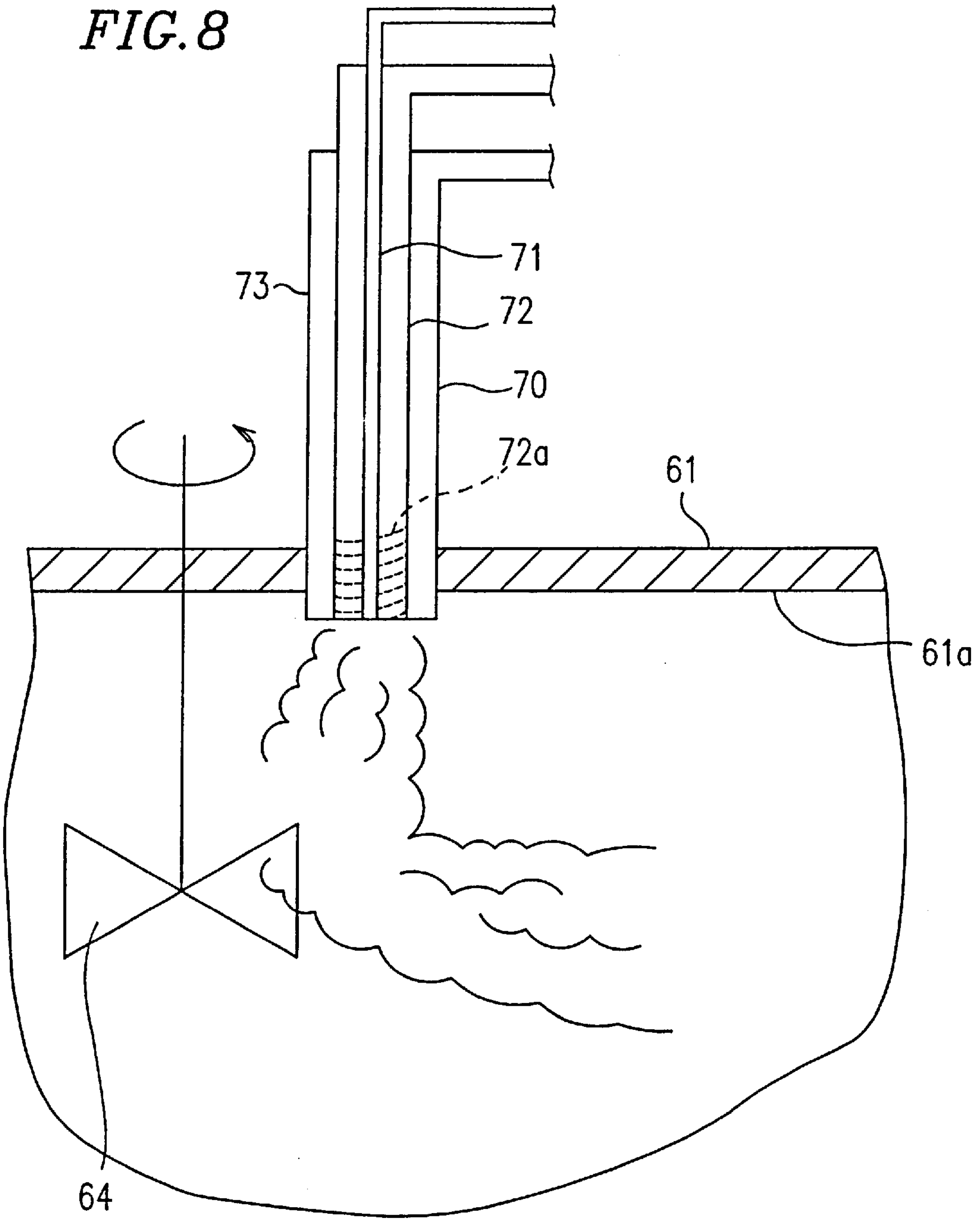
FIG. 8 is a schematic cross-sectional view of illustrating still another conventional method for supplying alcohol into a heat treatment furnace.

FIG. 5A is a partially cut cross-sectional view of a nozzle 84 in still another example, and FIG. 5B is a cross-sectional view of the nozzle 84 taken along lines B—B in FIG. 5A. The venturi section 43 is divided into two parts 44*a* and 44*b* (FIG. 5B) downstream with respect to the nitrogen gas introduction pipe 42. The tip 41*a* of the alcohol introduction pipe 41 is also divided into two parts 41*a*' and 41*a*", and the two parts 41*a*' and 41*a*" of the tip 41 a are respectively connected to the two parts 44*a* and 44*b* of the venturi section 43. The alcohol released from the nozzle 84 in an atomized state is forcefully expelled in two different directions along the wall 3 of the heat treatment furnace 1.

An atmospheric gas generator according to the present invention has the following effects.

(1) Limitations to space for installment can be alleviated and operating costs can be reduced by employing a PSA or a film separation system nitrogen generation apparatus. These apparatuses are relatively compact and can be installed in smaller spaces. Moreover, these apparatuses generate gas. Accordingly, the production cost is lower than the case of purchasing a nitrogen gas tank. Additionally, the legal restrictions regarding the high pressure gas involved in installing the high pressure gas tank need not be considered.

(2) Alcohol can be supplied at a constant pressure regardless of the amount and the pressure of the alcohol in the alcohol micropressure tank by employing an alcohol supplying device including an alcohol micropressure tank and a transfer pump. Moreover, since the alcohol micropressure tank can be kept open while alcohol is being supplied to the heat treatment furnace, the micropressure tank can be filled with alcohol during the supply. Thus, continuous heat treatment is possible. Since the pressure of nitrogen gas supplied to the alcohol micropressure tank for preventing external air from entering the alcohol micropressure tank is as low as 100 to 500 mmAq, the amount of nitrogen gas decomposing in alcohol is negligibly small. Therefore, nitrogen gas bubbles are not likely generated in an alcohol introduction pipe.

(3) Since the paths for supplying the nitrogen gas from the nitrogen gas supply device to the nozzle allows only nitrogen gas to pass therethrough, purity of nitrogen is constant. Such a constant purity allows for the control of flow rate by means of a flow meter. Nitrogen gas is inert and noncombustible, and thus can be used to expel inflammable gas for achieving safety of the furnace.

(4) The alcohol supply path for supplying the alcohol from the alcohol supply device to the nozzle allows alcohol to be supplied stably (up to an exit of an alcohol flow meter) at a supply pressure from the transfer pump. Flow rate is stable since there is no generation of nitrogen gas bubbles in the alcohol introduction pipe. Accordingly, the flow rate of the alcohol can be adjusted by a flow rate adjustment valve located at the exit of the alcohol flow meter.

(5) Alcohol is atomized by the pressure of nitrogen gas. A stirring fan can be eliminated, which increases the degree of freedom of the positioning of the alcohol introduction pipe.

(6) Since no heater is used for atomizing alcohol, a heat source and the maintenance thereof are not necessary. Since alcohol is atomized by a high pressure of the nitrogen gas, the alcohol can easily reach a heat source for decomposition of alcohol.

(7) Alcohol is supplied in a liquid state through a nozzle to a venturi section located at an end thereof, through a passage different from that provided for nitrogen gas. Then, the alcohol is atomized in the vicinity of the opening of the venturi section by the pressure of nitrogen gas. Therefore, the flow rate is stable and there is no limitation with respect to the direction or orientation of installment of the nozzle.

(8) The venturi section allows nitrogen and alcohol at the end of the nozzle to be forcefully expelled in a direction perpendicular to the direction in which the nozzle is inserted so that nitrogen gas and alcohol in an atomized state flow along a wall of the furnace even though the nozzle is not provided in the vicinity of a stirring fan. Accordingly, the position for installing the nozzle can be selected freely.

(9) The motion of a shut-off valve provided on the alcohol supply pipe and the motion of a nitrogen gas shut-off valve connected to the alcohol supply pipe are controlled, so that nitrogen gas is caused to flow through an alcohol introduction pipe of the alcohol supply nozzle after the introduction of alcohol is terminated. This prevents clogging of the alcohol introduction pipe due to soot resulting from burning alcohol.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

I claim:

1. An atmospheric gas generator for heat treatment, comprising:

a heat treatment furnace for performing heat treatment of a metal material;

an alcohol supply device for supplying alcohol to the heat treatment furnace;

a nitrogen gas supply device for supplying nitrogen gas to the heat treatment furnace; and a nozzle having an end protruding into the heat treatment furnace;

the atmospheric gas generated by introduction of the alcohol supplied by the alcohol supply device and the nitrogen gas supplied by the nitrogen gas supply device into the heat treatment furnace via the nozzle; and the nozzle including an alcohol introduction pipe, a nitrogen gas introduction pipe, and a venturi section provided in connection with a tip of the alcohol introduction pipe and with a tip of the nitrogen gas introduction pipe.

2. The atmospheric gas generator according to claim 1, wherein the venturi section includes a small-diameter portion and a funnel-shaped large-diameter portion provided downstream with respect to the small-diameter portion, and the tip of the alcohol introduction pipe is coupled at least in part to the large-diameter portion.

3. The atmospheric gas generator for heat treatment according to claim 1, wherein the venturi section is provided perpendicular to a direction in which the nozzle protrudes into the heat treatment furnace, so as to expel the atmospheric gas from the large-diameter portion to be released along a wall of the heat treatment furnace.

4. The atmospheric gas generator for heat treatment according to claim 1, wherein the alcohol supply device includes a transfer pump and is connected to the nozzle via an alcohol supply path.

5. The atmospheric gas generator for heat treatment according to claim 1, wherein the alcohol introduction pipe is provided inside the nitrogen gas introduction pipe.

6. The atmospheric gas generator for heat treatment according to claim 1, further comprising:

an alcohol supply pipe for supplying the alcohol to the alcohol introduction pipe of the nozzle from the alcohol supply device, the supply pipe having a first shutoff valve closable in response to an alcohol supply termination signal from a control device; and a nitrogen gas supply pipe for supplying the nitrogen gas from the nitrogen gas supply device to the nitrogen gas introduction pipe of the nozzle, the alcohol supply pipe and the nitrogen gas supply pipe connected to each other by a connection pipe downstream with respect to the first shut-off valve, and the connection pipe having a second shut-off valve openable in response to an alcohol supply termination signal from the control device.

* * * * *